(12) United States Patent
Liu et al.

(10) Patent No.: US 12,051,457 B2
(45) Date of Patent: Jul. 30, 2024

(54) HIGH-DENSITY MEMORY CELLS AND LAYOUTS THEREOF

(71) Applicant: Taiwan Semiconductor Manufacturing Co., Ltd., Hsinchu (TW)

(72) Inventors: Jen-Chieh Liu, Hsinchu (TW); Jui-Jen Wu, Hsinchu (TW); Win-San Khwa, Taipei (TW); Yi-Lun Lu, New Taipei (TW); Meng-Fan Chang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/664,465

(22) Filed: May 23, 2022

(65) Prior Publication Data

US 2023/0317132 A1    Oct. 5, 2023

Related U.S. Application Data

(60) Provisional application No. 63/362,050, filed on Mar. 29, 2022.

(51) Int. Cl.
  *G11C 11/34*      (2006.01)
  *G11C 11/405*     (2006.01)

(52) U.S. Cl.
  CPC .................................. *G11C 11/405* (2013.01)

(58) Field of Classification Search
  CPC .................................................. G11C 11/405
  See application file for complete search history.

(56) References Cited

U.S. PATENT DOCUMENTS

| | | | |
|---|---|---|---|
| 5,652,728 A * | 7/1997 | Hosotani | G11C 11/4099 365/210.15 |
| 5,661,678 A | 8/1997 | Yoshida et al. | |
| 7,272,034 B1 | 9/2007 | Chen et al. | |
| 7,859,889 B2 | 12/2010 | Kameshiro et al. | |
| 8,773,173 B2 | 7/2014 | Watanabe | |
| 2001/0035548 A1 * | 11/2001 | Wahlstrom | G11C 11/4074 257/E21.396 |
| 2007/0002611 A1 * | 1/2007 | Ye | G11C 7/062 365/177 |
| 2021/0166751 A1 | 6/2021 | Teman et al. | |
| 2023/0162774 A1 | 5/2023 | Young et al. | |

FOREIGN PATENT DOCUMENTS

| | | |
|---|---|---|
| JP | H08222706 A | 8/1996 |
| JP | 2002093924 A | 3/2002 |
| JP | 2006294116 A | 10/2006 |
| JP | 2013130802 A | 7/2013 |
| TW | 202145219 A | 12/2021 |

* cited by examiner

*Primary Examiner* — Uyen Smet
(74) *Attorney, Agent, or Firm* — Slater Matsil, LLP

(57) ABSTRACT

A device includes a write bit line and a read bit line extending in a first direction, and a write word line and a read word line extending in a second direction perpendicular to the first direction. The device further includes a memory cell including a write transistor and a read transistor. The write transistor includes a first gate connected to the write word line, a first source/drain connected to the write bit line, and a second source/drain connected to a data storage node. The read transistor includes a second gate connected to the data storage node, a third source/drain connected to the read bit line, and a fourth source/drain connected to the read word line.

20 Claims, 15 Drawing Sheets

| WWL0 | RWL0 | WBL | NS0 | RBL |
|---|---|---|---|---|
| SW0=VSS (MW0 on) | DR0=VSS | DIN0=H | H | No current |
| SW0=VSS (MW0 on) | DR0=VSS | DIN0=L | L | No current |

Fig. 5

| WWL0 | RWL0 | WBL | NS0 | RBL |
|---|---|---|---|---|
| SW0=VDD (MW0 off) | DR0=Vread | No requirement | H | MR0 off | No current |
| SW0=VDD (MW0 off) | DR0=Vread | No requirement | L | MR0 on | Read current |

Fig. 6

| WWL | RWL | WBL | NS | RBL |
|---|---|---|---|---|
| SW=VDD (MW on) | DR=VSS | DIN=H | H | No current |
| SW0=VDD (MW on) | DR=VSS | DIN=L | L | No current |

Fig. 13

| WWL | RWL | WBL | NS | RBL |
|---|---|---|---|---|
| SW=VSS (MW off) | DR=Vread | No requirement | H | Read current |
| SW=VSS (MW off) | DR=Vread | No requirement | L | MR off | No current |

Fig. 14

HIGH-DENSITY MEMORY CELLS AND LAYOUTS THEREOF

PRIORITY CLAIM AND CROSS-REFERENCE

This application claims the benefit of the following provisionally filed U.S. Patent application: Application No. 63/362,050, filed on Mar. 29, 2022, and entitled "Principle Layout Design of FinFET Based 3T Gain Cell for High-Density and Performance-Adjustable Low-Level Cache Memory," which application is hereby incorporated herein by reference.

BACKGROUND

Integrated circuit processors need to fetch data from memories. Dynamic Random-Access Memories (DRAM) are often used. The DRAMs, however, are not efficient enough in the access speed and power consumption. The inefficiency in the data access is referred to as "memory wall." It is necessary to overcome the "memory wall" for high-performance computing processors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4 and 5 illustrate the write operation of a memory cell pair in accordance with some embodiments.

FIG. 6 illustrates the read operation of a memory cell pair in accordance with some embodiments.

FIGS. 13 and 14 illustrate the write operation and the read operation, respectively, of a memory cell pair formed using n-type transistors in accordance with some embodiments.

DETAILED DESCRIPTION

Figure 1:
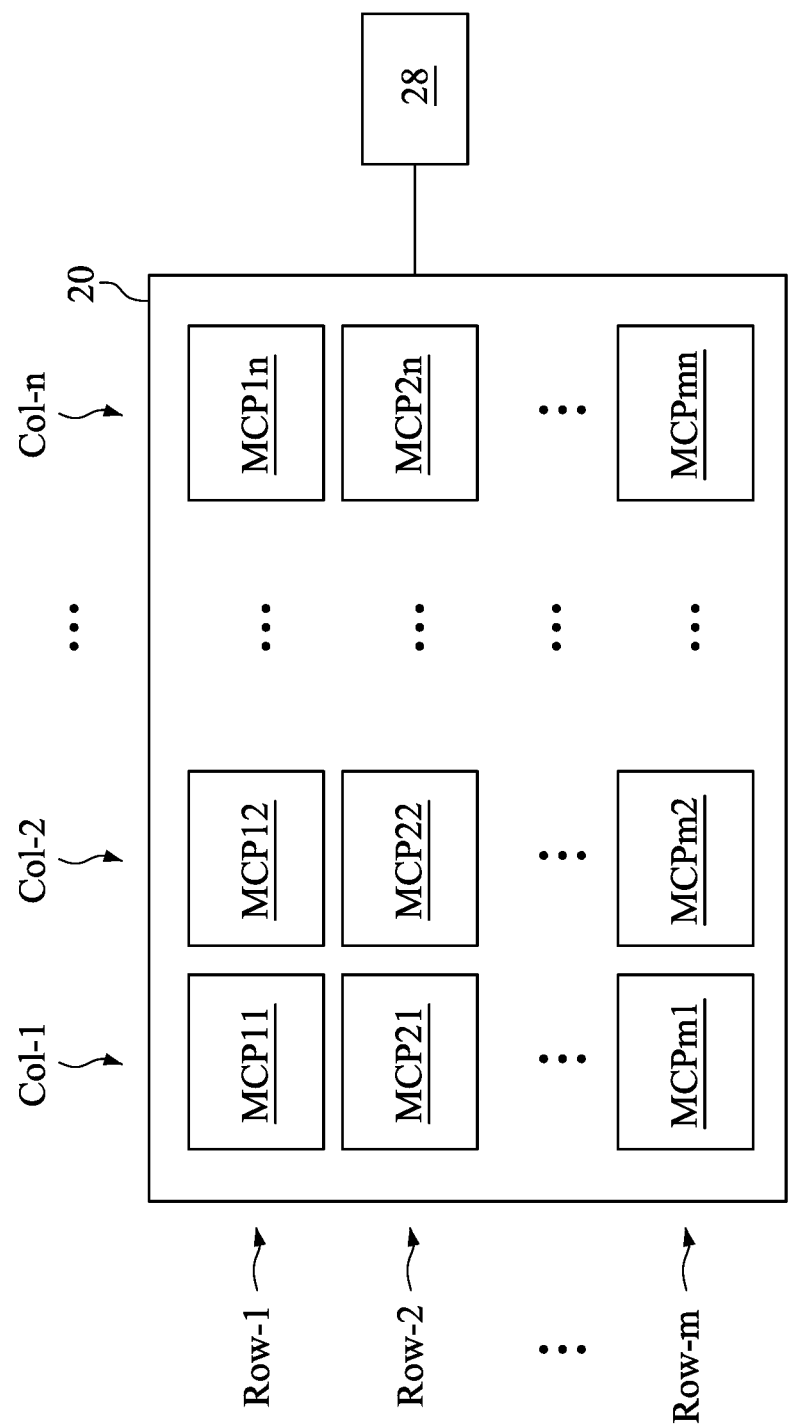
FIG. 1 illustrates a schematic diagram of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A memory cell and the corresponding memory cell pair and memory array are provided. In accordance with some embodiments of the present disclosure, a memory cell includes a write transistor configured to write an input data to a data storage node in response to a write signal, and a read transistor configured to output an output data in response to the stored data at the data storage node and a read signal. The write transistor has a first source/drain region (which may be a source region or a drain region) connecting to a write bit line, and a second source/drain region connecting to the data storage node. A first gate of the write transistor is connected to a write word line. The read transistor has a second gate connected to the data storage node, a third source/drain region connecting to a read word line, and fourth source/drain region connecting to a read bit line. The memory cell may or may not include a dummy transistor. With the small number of transistors (as few as two), the memory cell has high operation speed and small size. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Referring to FIG. 1, memory array 20 is formed. Memory array 20 includes a plurality of memory cell pairs (MCPs), which are allocated as a plurality of rows and a plurality of columns. The total number of rows of the memory cell pairs is m, which is an integer. The rows of the memory cell pairs are thus denoted as Row-1, Row-2 . . . through Row-m. Integer m may be the multiple of 2, and may be a number selected from, for example, 64, 128, 256, 512, 1024, and so on. Since each of the plurality of memory cell pairs MCP includes two memory cells, the total number of memory cells in memory array is equal to 2*m.

The total number of columns of the memory cell pairs is n, which is an integer. The columns of the memory cell pairs are thus denoted as Col-1, Col-2 . . . through Col-n. Integer n may also be the multiple of 2, and may be a number selected from, for example, 64, 128, 256, 512, 1024, and so on. The positions of the memory cell pairs MCP are indicated by their corresponding row numbers followed by column numbers. For example, the memory cell pair in row m and column n is identified as memory cell pair MCPmn (or MPCm_n). It is noted that when one or both of the row number and column number includes more than one digit, the row number and the column number may be separated by the sign ".". For example, the memory cell MCP at row 10 and column 12 may be referred to as MCP10_12, rather than MCP1012. The total number of memory cell pairs is thus equal to (m×n), while the total number of memory cells in memory array 20 is equal to (2× m× n).

Figure 2A:
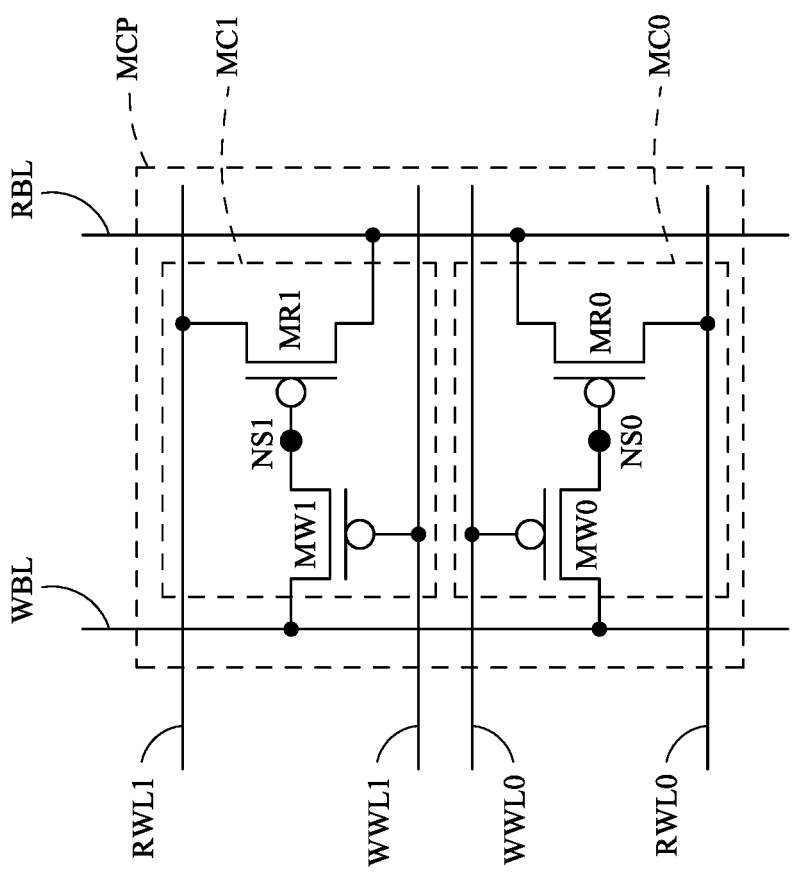
FIG. 2A illustrates the circuit diagram of a memory cell pair in accordance with some embodiments.

FIG. 2A illustrates the circuit diagram of a two-transistor (2T) memory cell pair MCP in accordance with some embodiments. Memory cell pair MCP includes memory cell MC0 and memory cell MC1. Memory cells MC0 and MC1 may be flip-mirrored to each other. Accordingly, memory cells MC0 and MC1 are also sometimes referred to as being line-symmetrical to each other. In accordance with some embodiments, each of memory cells MC0 and MC1 includes two transistors, and hence the corresponding memory cells MC0 and MC1 are referred to as 2T gain cells. In accordance with alternative embodiments, each of memory cells MC0 and MC1 may include more than two transistors such as 2.5 transistors, three transistors, or the like.

Memory cell MC0 comprises write transistor MW0 and read transistor MR0. Memory cell MC1 comprises write transistor MW1 and read transistor MR1. A first terminal (for example, the source) of the write transistor MW0 is coupled to (and may be directly connected to) a write bit line WBL. A second terminal (for example, the drain) of the write transistor MW0 is coupled to (and may be directly connected to) data storage node NS0. A control terminal (the gate) of the write transistor MW0 is coupled to (and may be directly connected to) write word line WWL0.

A first terminal (for example, the source) of the read transistor MR0 is coupled to (and may be directly connected to) read bit line RBL. A second terminal (for example, the drain) of the read transistor MR0 is coupled to (and may be directly connected to) a read word line RWL0. A control terminal (gate) of the read transistor MR0 is coupled to (and may be directly connected to) the data storage node NS0.

Memory cell MC1 comprises write transistor MW1 and read transistor MR1. A first terminal (for example, the source) of the write transistor MW1 is coupled to write bit line WBL. A second terminal (for example, the drain) of the write transistor MW1 is coupled to data storage node NS1. A control terminal (the gate) of the write transistor MW1 is coupled to a write word line WWL1.

A first terminal (for example, the source) of the read transistor MR1 is coupled to read bit line RBL. A second terminal (for example, drain) of the read transistor MR1 is coupled to a read word line RWL1. A control terminal (gate) of first read transistor MR1 is coupled to the data storage node NS1.

In accordance with some embodiments, the connections of write transistor MW0 and read transistor MR0 to read bit lines, write bit line, read word lines, write bit lines, etc., are direct connections, without additional devices such as resistors, capacitors, etc., therebetween. In accordance with alternative embodiments, some of the connections of write transistor MW0 and read transistor MR0 to read bit lines, write bit line, read word lines, write bit lines, etc., are indirect connections, which may include additional devices such as resistors, capacitors, etc., therebetween.

In accordance with some embodiments, all of the transistors in memory cell pair CMP (including write transistor MW0 and MW1 and read transistor MR0 and MR1) are of the same type, for example, p-type (having p-type source and drain regions) or n-type (having n-type source and drain regions). Furthermore, all of the transistors in memory cell pairs may have the same structure such as planar transistor structures, Fin Field-Effect Transistor (FinFET) structures, Gate-All-Around (GAA) transistor structures, or the like.

Figure 2B:
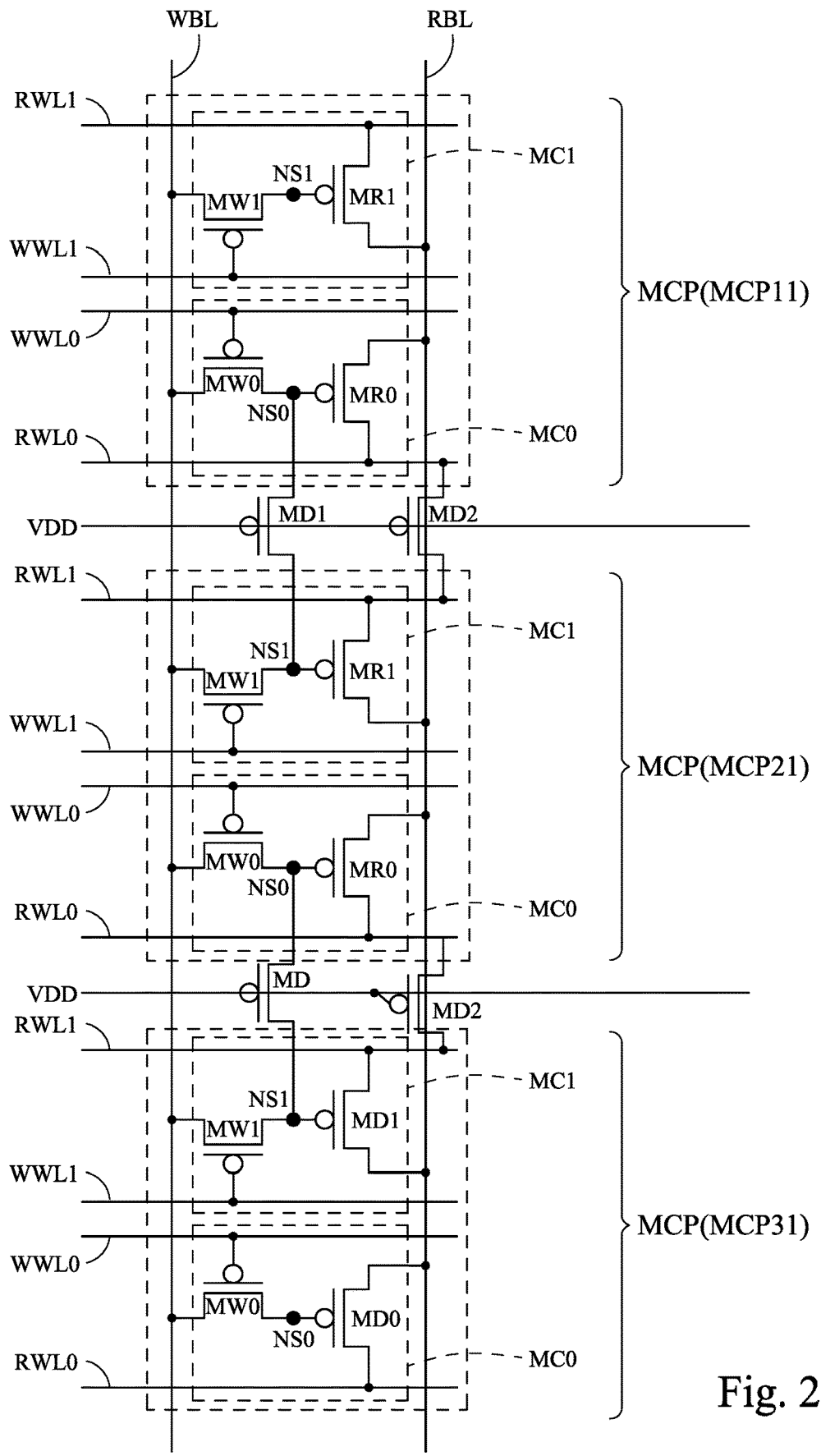
FIG. 2B illustrates the circuit diagram of a plurality of memory cell pairs in neighboring rows in accordance with some embodiments.

FIG. 2B illustrates the circuit diagram of a plurality of neighboring two-transistor (2T) memory cell pairs MCP in a same column in accordance with some embodiments. The plurality of memory cell pairs MCP share a same write bit line WBL and a same read bit line RBL, and have separate write bit lines and read bit lines.

In accordance with some embodiments, the neighboring rows of memory cell pairs MCP may be separated from each other by dummy transistors MD1 and/or MD2. Dummy transistors MD1 and MD2 are fully functional transistors, and are turned off all the time during the operation of the memory array 20. In accordance with some embodiments in which dummy transistors MD1 and MD2 are p-type transistors, a high voltage (such as VDD) may be connected to the gates of the dummy transistors MD1 and MD2 to turn these transistors off. The source and drain regions of dummy transistors MD1 and MD2 are connected to the data storage nodes NS0 and NS1 in neighboring memory cell pairs MCP. The function of dummy transistors MD1 and MD2 may be found in the subsequent discussion of FIG. 3. Dummy transistors MD1 and MD2 may be of the same conductivity type as, or may be of an opposite conductivity type than, write transistors MW0 and MW1 and read transistors MR0 and MR1.

Figure 3:
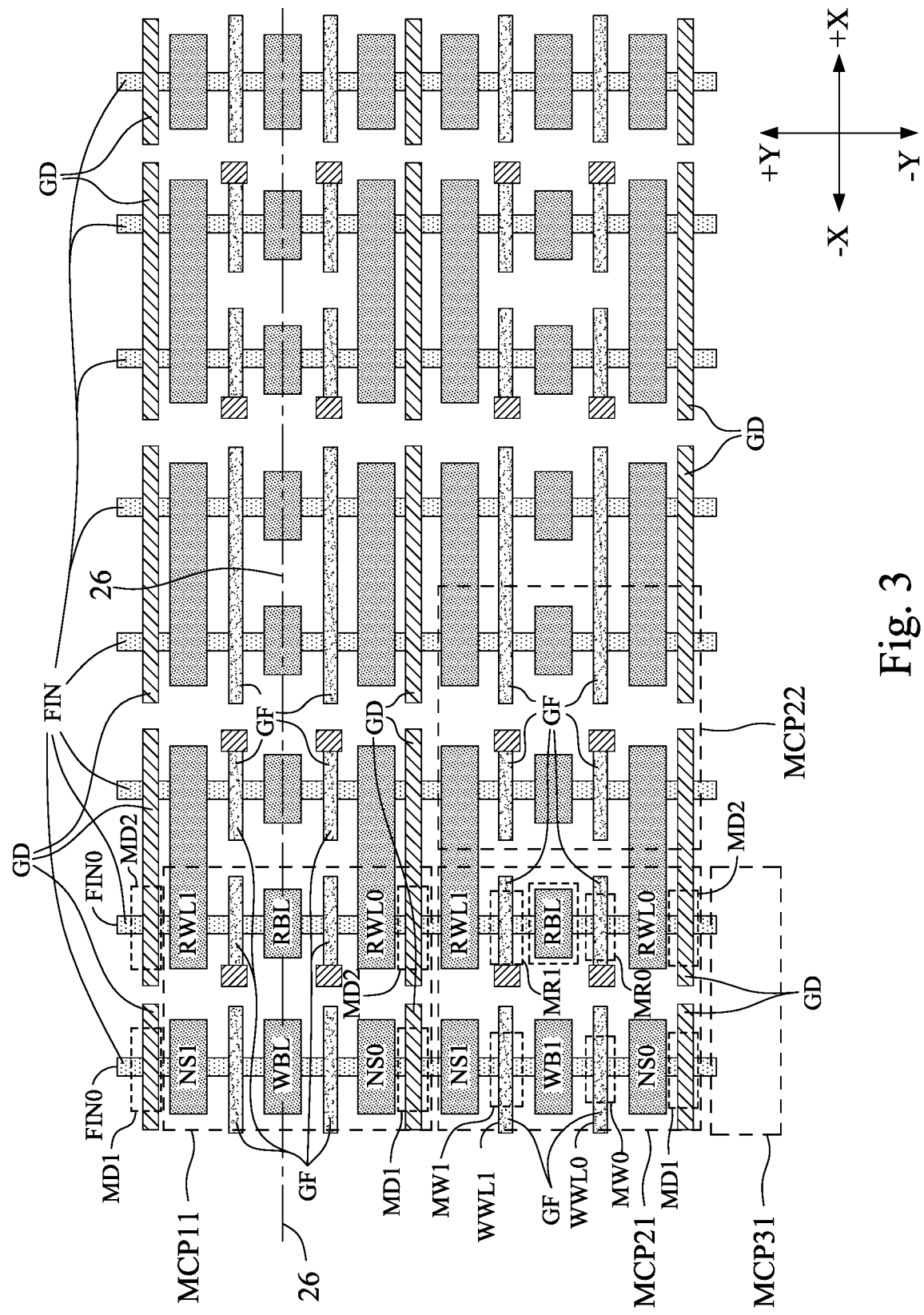
FIG. 3 illustrates the layout of memory cell pairs including dummy transistors in accordance with some embodiments.

FIG. 3 illustrates an example layout of the embodiments shown in FIG. 2B. It is appreciated that the layout as shown in FIG. 3 (and the layouts in other figures) are also the top views of the memory devices that are formed on physical wafers (such as silicon wafer). The illustrated layouts use FinFETs as examples, while other types of transistors may also be used.

A plurality of (semiconductor) fins (marked as FIN, including FINs FIN0 and FIN1) are formed to be parallel to each other, and extend in the Y direction. A plurality of gate stacks (gates) extend in the X direction. The gate stacks include gate stacks GD, which are the gate stacks of dummy transistors MD1 and MD2. Gate stacks GD may be connected to positive power supply voltage VDD when dummy transistors MD1 and MD2 are p-type transistors, and power supply voltage VSS (electrical ground) when dummy transistors MD1 and MD2 are n-type transistors. The gate stacks further include gate stacks GF, which are the gate stacks of functional transistors, including write transistors MW0 and MW1 and read transistors include MR0 and MR1.

Data storage nodes NS0 and NS1 may be formed between neighboring gate stacks GF and GD. Data storage nodes NS0 and NS1, read word lines RWL0 and RWL1, read bit lines RBL, and write bit line WBL may include source/drain regions and the respective source/drain contact plug in accordance with some embodiments.

As shown in FIG. 3, three memory cell pairs $MCP_{11}$, $MCP_{21}$, and $MCP_{31}$ are in neighboring rows. In each of memory cell pairs $MCP_{11}$, $MCP_{21}$, and $MCP_{31}$, memory cells $MC_o$ and $MC_1$ are line-symmetrical to each other relative to the straight lines that are in the middle of the corresponding memory cell pairs and extending in the X-direction. For example, the memory cells $MC_o$ and $MC_1$ in memory cell pair $MCP_{11}$ are line-symmetrical to straight line 26. Alternatively stated, the memory cells $MC_o$ and $MC_{11}$ in each of the memory cell pairs are flipped relative to a first straight line in the middle of the corresponding memory cell pair, which straight line extends in the X direction.

In accordance with some embodiments, the write transistors MW0 and MW1 of all memory cell pairs in the same column share the same semiconductor fin (such as FIN0), which may be broken at selected positions. The read transistors MR0 and MR1 of all memory cell pairs in the same column share the same semiconductor fin (such as FIN1). Furthermore, semiconductor fin FIN0 is connected to write bit line WBL, and extends into all memory cells in the same column. Semiconductor fin FIN1 is connected to read bit line RBL, and extends into all memory cells in the same column.

As shown in FIG. 3, the data storage node NS0 in memory cell pair MCP11 is neighboring the data storage node NS1 in memory cell pair MCP21 with a small distance due to the compact size of the memory cell pairs. Dummy transistor MD1 is formed between the neighboring data storage nodes NS0 and NS1. In accordance with some embodiments in which dummy transistor MD1 is a p-type transistor, voltage VDD is applied to the gate GD of dummy transistor MD1. Dummy transistor MD1 is turned off, and hence electrically and signally disconnects the data storage node NS0 in memory cell pair MCP11 from the data storage node NS1 in memory cell pair MCP21.

In accordance with alternative embodiments, instead of having the two neighboring data storage nodes NS0 and NS1 electrically disconnected by dummy transistor MD1, the fin FIN0 may be physically cut where gate GD is located, so that neighboring data storage nodes NS0 and NS1 are physically (and also electrically) separated from each other. In which case, the dummy gate GD of the dummy transistor MD1 will not be formed. The corresponding circuit diagram is similar to what is shown in FIG. 2B, except that dummy transistor MD1 will not be formed.

Similarly, the read word line RWL0 in memory cell pair MCP11 is neighboring the read word line RWL1 in memory cell pair MCP21 with a small distance due to the compact size of the memory cell pairs. Dummy transistor MD2 is formed between the neighboring read word lines RWL0 and RWL1. In accordance with some embodiments in which dummy transistor MD2 is a p-type transistor, voltage VDD is applied to the gate GD of dummy transistor MD2. Dummy transistor MD2 is turned off, and electrically and signally disconnects the read word line RWL0 in memory cell pair MCP11 from the read word line RWL1 in memory cell pair MCP21.

In accordance with alternative embodiments, instead of having the two neighboring read word lines RWL0 and RWL1 electrically disconnected by dummy transistor MD2, the fin FIN1 may be physically cut where gate GD is located, so that neighboring read word lines RWL0 and RWL1 are physically (and also electrically) separated from each other. In which case, the dummy gate GD of the dummy transistor MD2 will not be formed. The corresponding circuit diagram is similar to what is shown in FIG. 2B, except that dummy transistors MD2 will not be formed.

Figure 4:
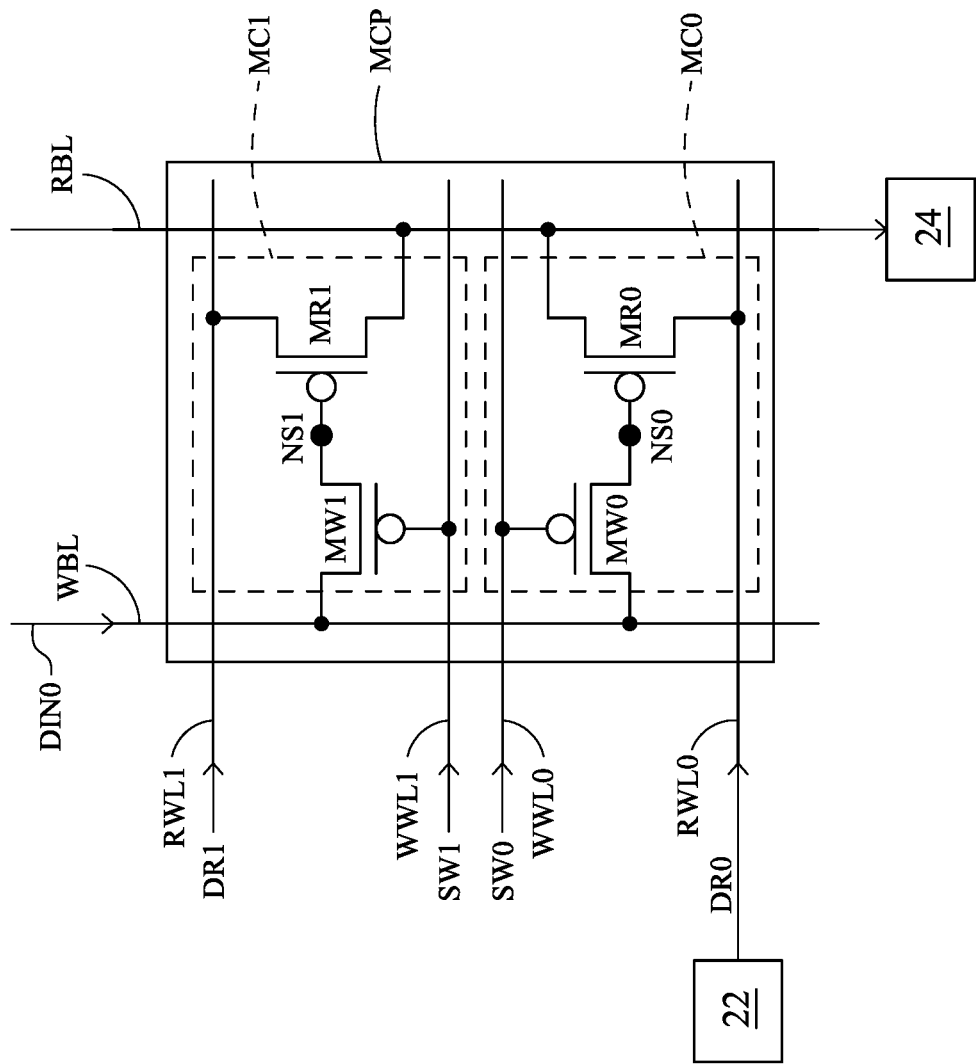

An example write operation in accordance with some embodiments is discussed as follows referring to FIGS. 4 and 5. FIG. 4 illustrates the corresponding signals for the write operation, while FIG. 5 illustrates a table showing the lines and nodes in memory cell pair MCP and the corresponding signals/voltages during the write operation. The example transistors discussed referring to FIG. 4 are p-type transistors.

Referring to FIG. 4, assuming at a time, memory cell MC0 is to be written into, write transistor MW0 is selected by the write signal SW0, which may be equal to voltage VSS, as shown in FIG. 5. Therefore, the write transistor MW0 is turned on. The write transistor MW0 writes the first input data DIN0 on the write bit line WBL to data storage node NS0. Therefore, a logic value on the data storage node NS0 is written the same as the logic value of the input data DIN0. The stored data may be "H" (high) or "L" (low) corresponding to the high-voltage signal (such as VDD) and the low-voltage signal (such as VSS), respectively.

At the time the write operation is performed, the read signal DR0 (FIG. 4) on the read word line RWL0 is equal to low voltage VSS. Therefore, there is no current on the read bit line RBL regardless of the logic value (high or low, as in FIG. 5) on the data storage node NS0. Accordingly, the power consumption during the write operation is reduced.

FIGS. 4 and 6 in combination illustrate an example read operation in accordance with some embodiments. FIG. 4 illustrates the corresponding signals for the read operation, while FIG. 6 illustrates a table showing the lines and nodes and the corresponding signals during the read operation. Assuming at a time, memory cell MC0 is to be read from, the write transistor MW0 is selected by the first write signal SW0 (SW0=VDD) on the write word line WWL0. Therefore, the write transistor MW0 is turned off. Data node NS0 is now a floating node. A read signal DR0 is applied to read word line RWL0. The read signal DR0 is equal to read voltage Vread, which is a non-zero voltage. Read voltage Vread is a voltage that is greater than VSS, and may be equal to or smaller than voltage VDD. The read voltage Vread may be generated by voltage source 22.

When the data storage node NS0 stores the data "H,", the read transistor MR0 is turned off (FIG. 6). Therefore, the output data on read bit line RBL is associated with "No current" on the read bit line RBL. Conversely, when the data storage node NS0 stores the data "L", the read transistor MR0 is turned on (FIG. 6). Therefore, the output data on read bit line RBL is associated with a "read current" on the read bit line RBL. The current on read bit line RBL may be detected by current-detection circuit 24, which is connected to the read bit line RBL. The "read current" is related to the voltage Vread, and the higher the voltage Vread is, the higher the current on read bit line RBL will be. To reduce the power consumption, the voltage Vread is reduced, as long as the generated current can be reliably detected by the current-detection circuit. For example, the voltage Vread may be in the range between about (1/5)*VDD and VDD, and may also be in the range between about (1/5)*VDD and about (4/5)*VDD in accordance with some embodiments. The operation of memory cell MC1 is essentially the same as memory cell MC0.

Referring back to FIG. 1, a control circuit 28 is connected to, and controls the operation of, memory array 20. For example, the write operations and the read operations of memory array 20 are controlled by control circuit 28. Control circuit 28 may include word line controllers, bit line controllers, voltage sources (including the voltage source 22 in FIG. 4), the current-detection circuit 24 in FIG. 4, the turning off of dummy transistors, and the like. Control circuit 28 may control and synchronize the write operations and read operations of memory array 20.

Figure 7:
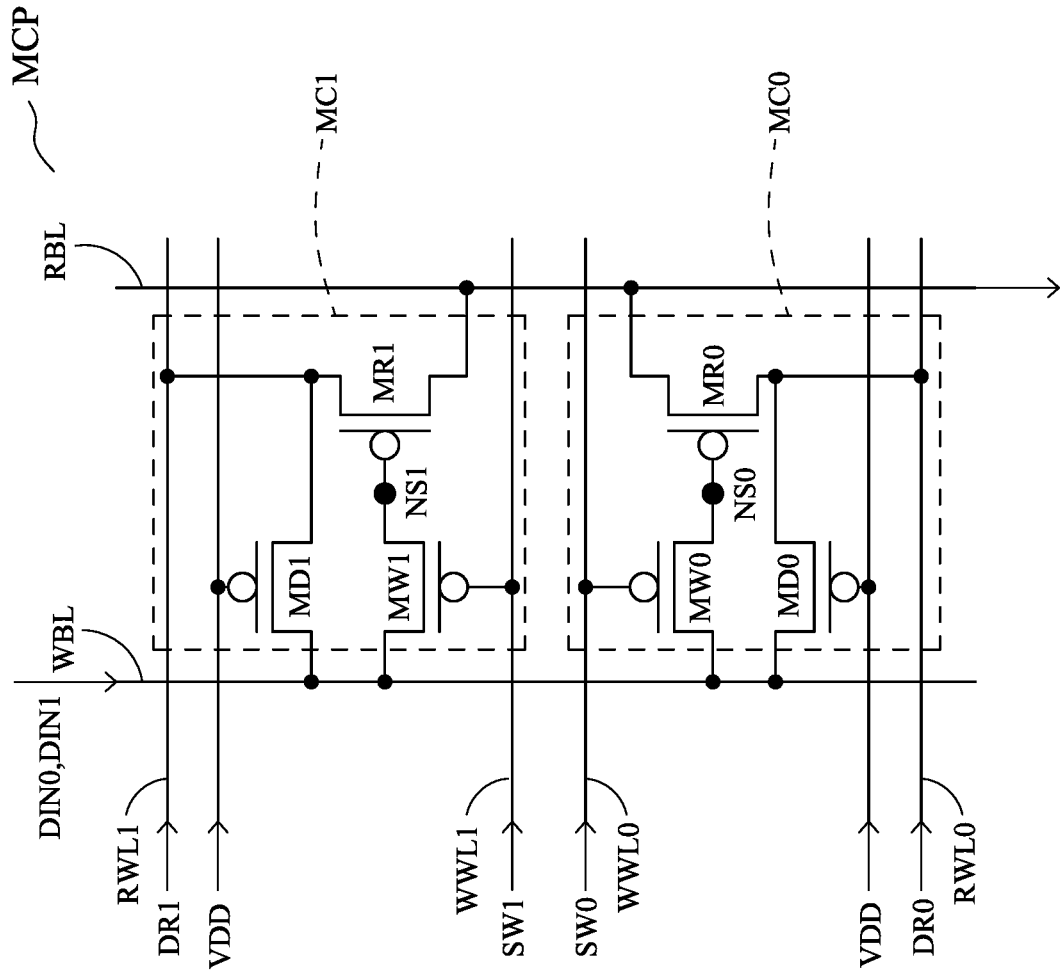
FIG. 7 illustrates the circuit diagram of a memory cell pair including dummy transistors in accordance with some embodiments.

FIG. 7 illustrates a three-transistor (3T) memory cell pair MCP, in which each of the memory cells MC0 and MC1 includes a write transistor (MW0 or MW1), a read transistor (MR0 or MR1), and a dummy transistor (MD0 or MD1). The gates of the dummy transistors MD0 and MD1 are connected to a high voltage such as voltage VDD. Accordingly, during the entire operation of memory array 20, dummy transistors MD0 and MD1 are always turned off by the voltage VDD. The function of dummy transistors MD0 and MD1 is to prevent the nodes (such as data storage node NS0 and the data storage node NS1) in memory cells and/or memory cell pairs from being disturbed by their neighboring memory cells or memory cell pairs. The operation of the write transistors MW0 and MW1 and read transistors MR0 and MR1 during the read operations and write operations are the same as discussed referring to FIGS. 4, 5, and 6. The details are not repeated herein.

Figure 8:
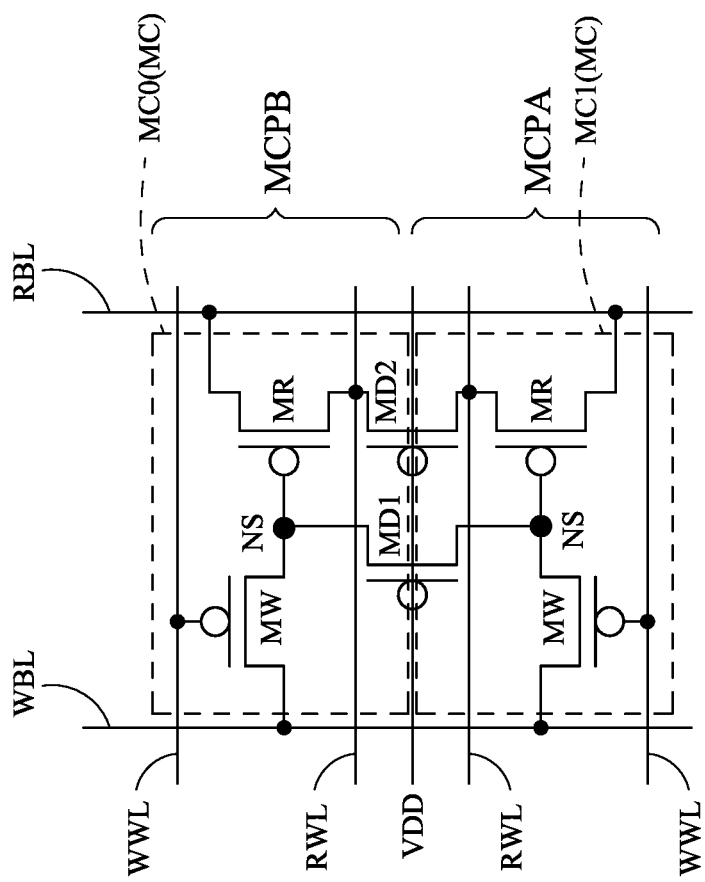
FIG. 8 illustrates the circuit diagram of two neighboring memory cell pairs sharing dummy transistors in accordance with some embodiments.

FIG. 8 illustrates the circuit diagram of parts of memory cell pair MCPA and MCPB, which are in neighboring memory cell pairs (in neighboring rows) in accordance with some embodiments. These embodiments are similar to the embodiments shown in FIG. 7, except that instead of having a dedicated dummy transistor in each of memory cells MC0 and MC1, two dummy transistors MD1 and MD2 are formed, each being shared by neighboring memory cell pairs MCPA and MCPB. This may also be considered that each of the memory cells MC owns a half of each of dummy transistors MD1 and MD2. Accordingly, each of memory cells MC on average owns three transistors, including a write transistor, a read transistor, and a half of each of two dummy transistors MD1 and MD2. Similarly, write word lines WWL are connected to the gates of write transistors MW. Write bit line WBL is connected to the source/drain regions of write transistors MW. Read bit line RBL is connected to the source/drain regions of read transistors MR. Read word lines RWL are connected to the source/drain regions of read transistors MR.

Dummy transistors MD1 and MD2 are also turned off during the entire operation of the memory cells and the corresponding memory array 20 (FIG. 1). In accordance with some embodiments, dummy transistors MD1 and MD2 are p-type transistors, and a high voltage VDD may be connected to the gates of the p-type dummy transistors MD1 and MD2 to turn them off. In accordance with alternative embodiments, two n-type dummy transistors MD1 and MD2 are formed, and their gates are connected to voltage VSS, so that the n-type dummy transistors MD1 and MD2 are turned off. The sourced/drain regions of the dummy transistor MD1 are connected to neighboring data storage nodes NS in neighboring memory cell pairs MCPA and MCPB, and hence electrically and signally decouples the neighboring data storage nodes NS from each other. The sourced/drain regions of the dummy transistor MD2 are connected to read word lines RWL0 and RWL1, and hence electrically and signally decouples read word lines RWL0 and RWL1 in neighboring memory cell pairs MCPA and CMPB from each other.

Figure 9A:
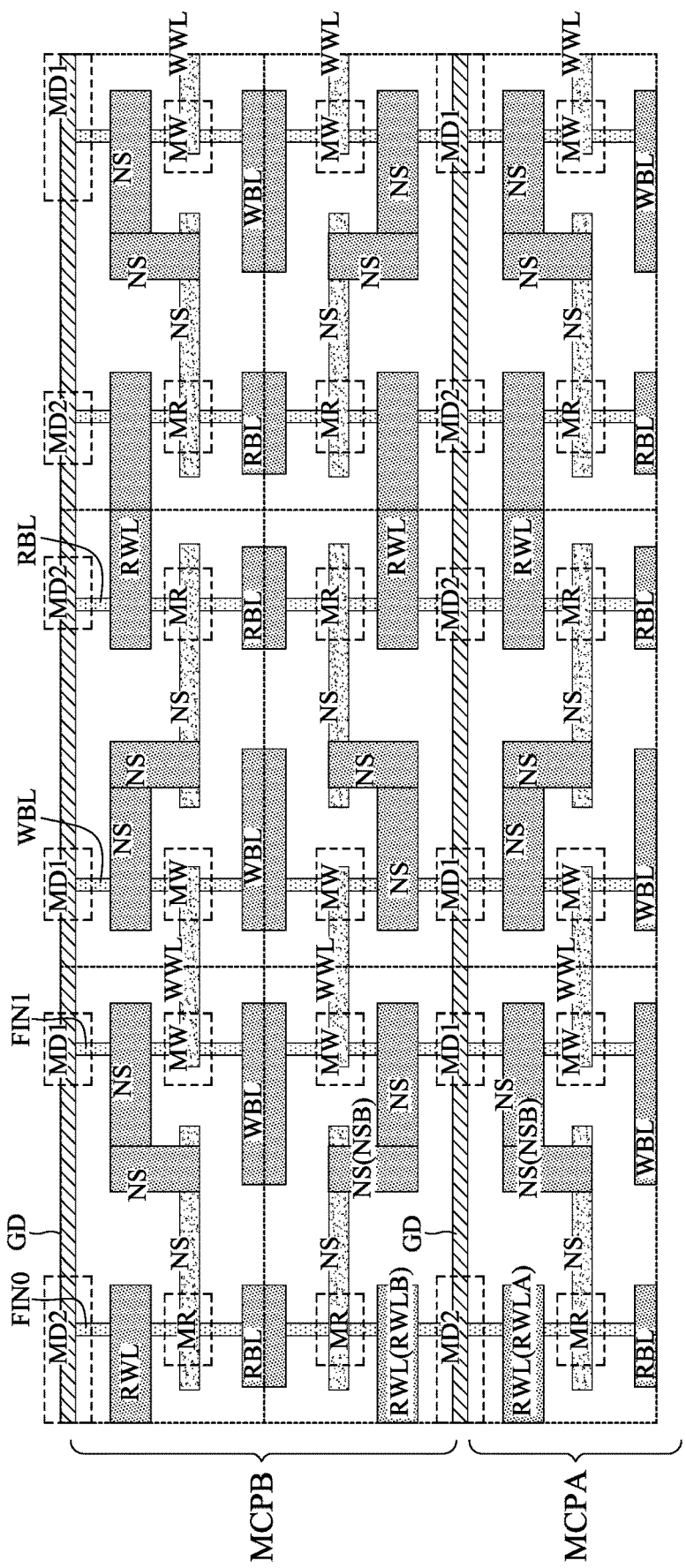
FIGS. 9A and 9B illustrate the layouts of a single-fin memory cell pair and a multi-fin memory cell pair, respectively, including shared dummy transistors in accordance with some embodiments.

FIG. 9A illustrates a layout of the circuit shown in FIG. 8. It is observed that the gate GD of dummy transistor MD1 extends on semiconductor fin FIN1. The part of semiconductor fin FIN1 in memory cell pair MCPA is connected to a data storage node NS (marked as NSA). The part of semiconductor fin FIN1 in memory cell pair MCPB is connected to a data storage node NS (marked as NSB). Accordingly, dummy transistor MD1 electrically decouples data storage nodes NSA and NSB from each other. The gate GD of dummy transistor MD2 is on semiconductor fin FIN0. The part of semiconductor fin FIN0 in memory cell pair MCPA is connected to a read word line RWL (marked as RWLA). The part of semiconductor fin FIN1 in memory cell pair MCPB is connected to a read word line RWL (marked as RWLB). Accordingly, dummy transistor MD2 electrically decouples read word lines RWLA and RWLB from each other. In accordance with some embodiments, the dummy transistors MD1 and MD2 in the same row share the same gate GD, which is a long gate extending into all columns of the memory array 20.

Figure 9B:
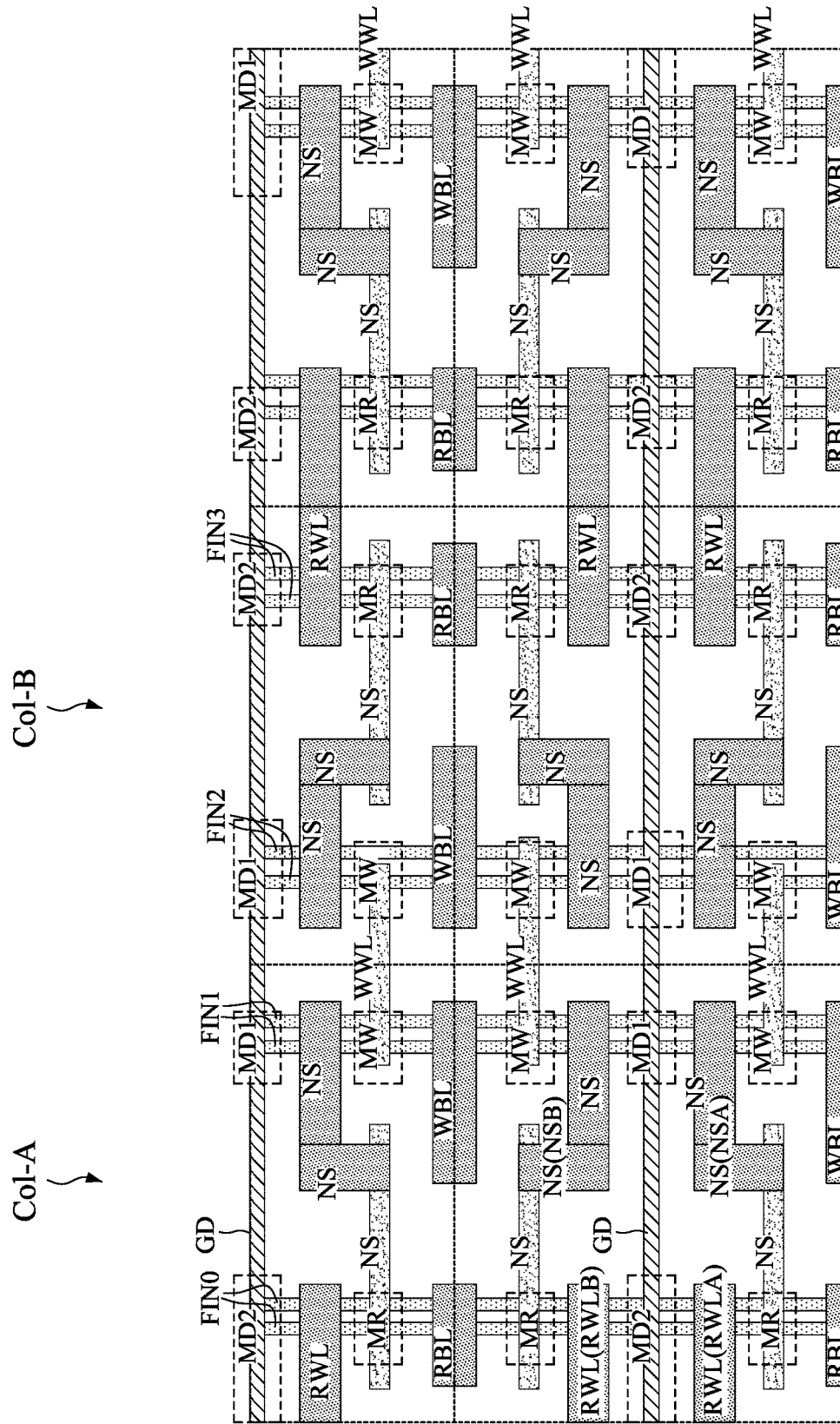

FIG. 9B illustrates a layout of the circuit shown in FIG. 8. This layout is similar to the layout shown in FIG. 9A, except that FIG. 9B illustrates multi-fin transistors, while FIG. 9A illustrates single-fin transistors. In addition, in FIG. 9B, a plurality of semiconductor fins FIN2 are connected to, and are used as, the write bit lines WBL in one column. A plurality of semiconductor fins FIN3 are connected to, and are used as the read bit lines RBL in one column. The response speed and the output current value of the memory cells will increase with the increase of number of the semiconductor fins. The memory cell pairs based on fins FIN0 and FIN1 are line-symmetrical to memory cell pairs based on fins FIN2 and FIN3 in accordance with some embodiments.

Figure 10:
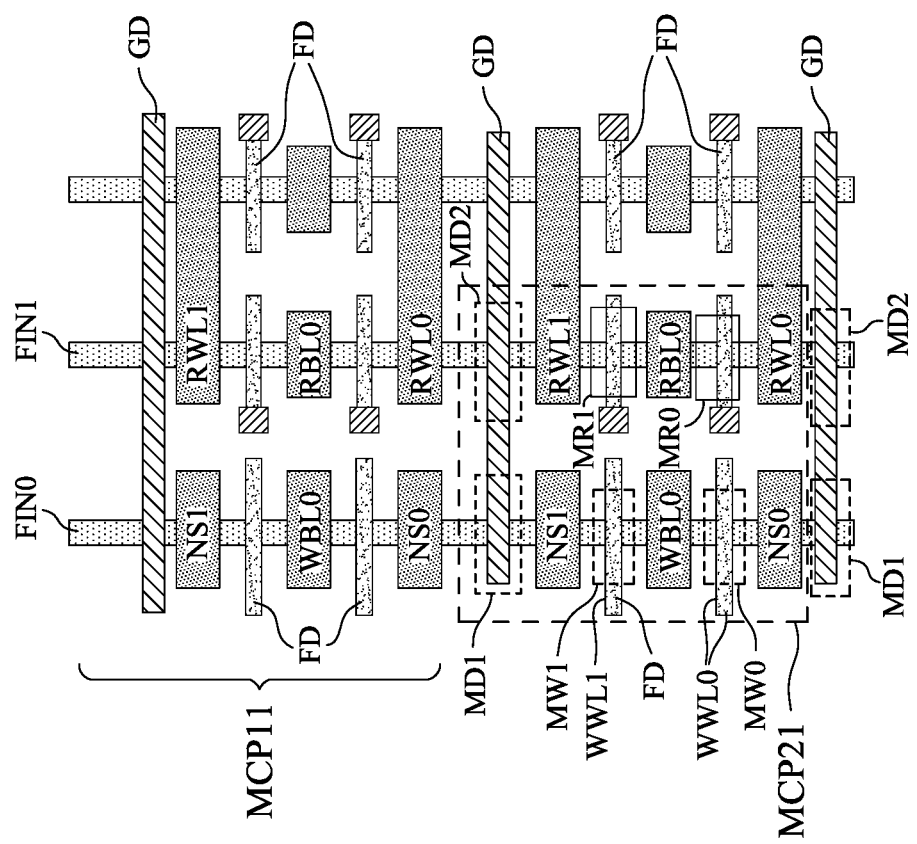
FIG. 10 illustrates the layout of a memory cell pair including an elongated gate in accordance with some embodiments.

FIG. 10 illustrates a layout of memory cell pairs MCP11 and MCP21. In accordance with these embodiments, the single gate stack GD in memory cell pair MCP21 extends to both of semiconductor fins FIN0 and FIN1, and hence form both of dummy transistors MD1 and MD2.

Figure ii illustrates parts of memory cell pairs MCPA and MCPB in accordance with some embodiments. These embodiments are similar to the embodiments shown in FIG. 8, except that instead of using p-type transistors, n-type transistors are used to form the memory cells MC and MCP pairs MCPA and MCPB. The illustrated part includes a half of memory cell pair MCPA and a half of memory cell pair MCPB. The whole structure of each of memory cell pairs MCPA and MCPB are similar to the memory cell pairs shown in FIGS. 2A, 2B, and 4, with the transistors being changed to n-type transistors.

In accordance with some embodiments, two n-type dummy transistors MD1 and MD2 are formed, each being shared by two memory cell pairs MCPA and MCPB. This may also be considered that each of the memory cells MC owns a half of each of dummy transistors MD1 and MD2. Accordingly, each of memory cells MC on average owns three transistors, including a write transistor, a read transistor, and a half of each of two dummy transistors MD1 and MD2. Similarly, write word lines WWL are connected to the gates of write transistors MW. Write bit line WBL is connected to the source/drain regions of write transistors MW. Read bit line RBL is connected to the source/drain regions of read transistors MR. Read word lines RWL are connected to the source/drain regions of read transistors MR.

Dummy transistors MD1 and MD2 are also turned off during the entire operation of the memory cells and the corresponding memory array 20. In accordance with some embodiments, n-type dummy transistors MD1 and MD2 are used, and a low voltage (such as voltage VSS) may be connected to the gates of the n-type dummy transistors MD1 and MD2 to turn them off. The sourced/drain regions of the dummy transistor MD1 are connected to neighboring data storage nodes NS in neighboring memory cell pairs MCPA and MCPB, and hence electrically and signally decouples the neighboring data storage nodes NS from each other. The sourced/drain regions of the dummy transistor MD2 are connected to neighboring read word lines RWL, and hence electrically and signally decouples read word lines RWL in neighboring memory cell pairs MCPA and CMPB from each other. In accordance with alternative embodiments, two p-type dummy transistors MD1 and MD2 may be used in the structure shown in FIG. 11, and the gates of the p-type dummy transistors MD1 and MD2 are connected to a high voltage such as voltage VDD, so that the p-type dummy transistors MD1 and MD2 are turned off.

Figure 11:
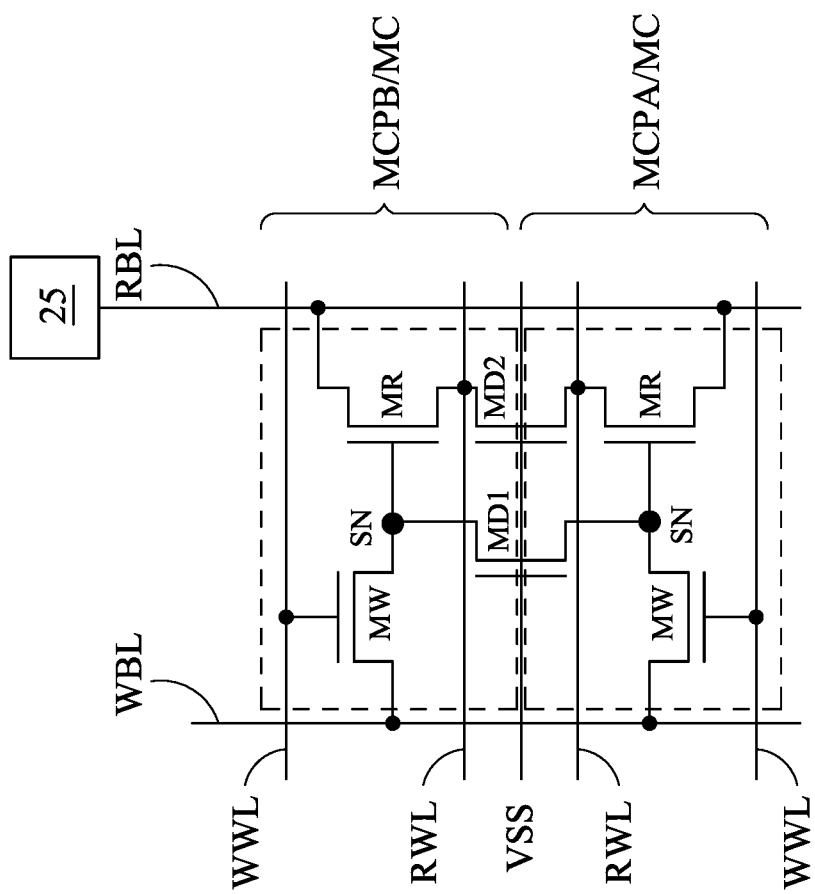
FIG. 11 illustrates the circuit diagram of a memory cell pair formed using n-type transistors in accordance with some embodiments.
Figure 12:
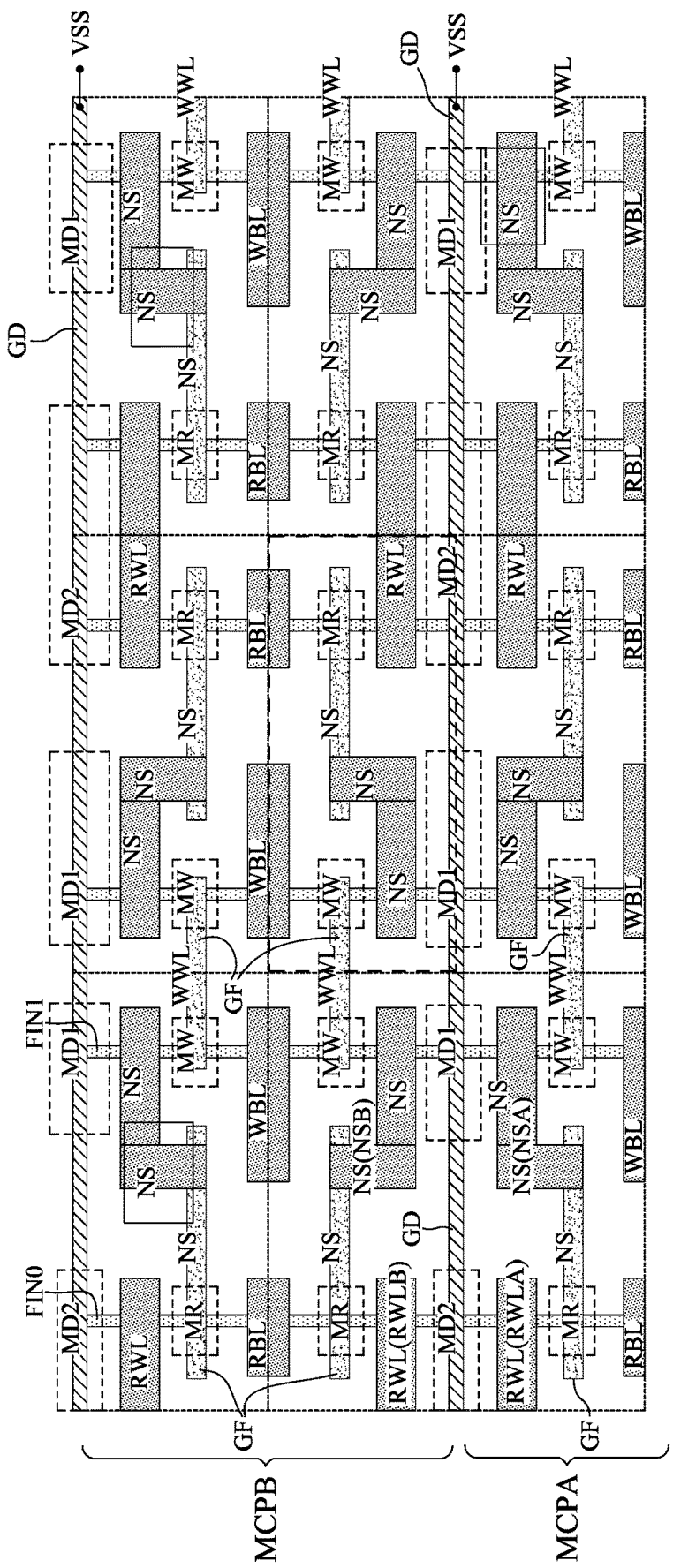
FIG. 12 illustrates the layout of a memory cell pair formed using n-type transistors in accordance with some embodiments.

FIG. 12 illustrates a layout of the circuit shown in FIG. 11. It is observed that the gate GD of dummy transistor $MD_1$ extends on semiconductor fin $FIN_1$. The part of semiconductor fin $FIN_1$ in memory cell pair MCPA is connected to a data storage node NS (marked as NSA). The part of semiconductor fin $FIN_1$ in memory cell pair MCPB is connected to a data storage node NS (marked as NSB). Accordingly, dummy transistor $MD_1$ electrically decouples data storage nodes NSA and NSB from each other. The gate GD of dummy transistor $MD_2$ extends on semiconductor fin $FIN_o$. The part of semiconductor fin $FIN_o$ in memory cell pair MCPA is connected to a read word line RWL (marked as RWLA). The part of semiconductor fin $FIN_1$ in memory cell pair MCPB is connected to a read word line RWL (marked as RWLB). Accordingly, dummy transistor $MD_2$ electrically decouples read word lines RWLA and RWLB from each other.

An example write operation of the MCP cells formed of n-type transistors (FIG. 11) is discussed as follows in accordance with some embodiments. FIG. 13 illustrates a table showing the lines and nodes in memory cell pair MCP and the corresponding signals during the write operation.

Assuming at a time, a memory cell MC is to be written into, the write transistor MW is selected by a write signal SW, which may be equal to voltage VDD, as shown in FIG. 13. Therefore, the write transistor MW is turned on. The write transistor MW writes the input data on the write bit line WBL to the corresponding data storage node NS. Therefore, a logic value on the data storage node NS is written the same as the logic value of the input data. The stored data may be "H" (high) or "L" (low) corresponding to the high-voltage signal (such as voltage VDD), and the low-voltage signal (such as voltage VSS), respectively.

At the time the write operation is performed, the read signal DR on the corresponding read word line RWL is equal to a low voltage (such as voltage VSS). Therefore, there is no current on the read bit line RBL regardless of the logic value (high or low, as in FIG. 5) on the data storage node NS. Accordingly, the power consumption during the write operation is reduced.

FIG. 14 illustrates an example read operation in accordance with some embodiments. FIG. 14 illustrates a table showing the lines and nodes in the corresponding memory cell during the read operation. Assuming at a time, a memory cell MC (FIG. 11) is to be read from, the write transistor MW is selected by signal SW, which is a low voltage VSS. Therefore, the write transistor MW is turned off. Data node NS is now a floating node. A read signal DR is applied to read word line RWL. The read signal is equal to read voltage Vread, which is a non-zero voltage. Read voltage Vread is a voltage that is greater than VSS, and may equal to or smaller than voltage VDD. The read voltage Vread may be generated by a voltage source 25 (FIG. 11), which is in control circuit 28 (FIG. 1).

When the data storage node NS stores the data "L,", the read transistor MR is turned off (FIG. 11). Therefore, the output data on read bit line RBL is associated with "No current" on the read bit line RBL. Conversely, when the data storage node NS stores the data "H", the read transistor MR is turned on (FIG. 11). Therefore, the output data on read bit line RBL is associated with a "read current" on the read bit line RBL, which may be detected by current-detection circuit 24 (FIG. 4) connected to the read bit line RBL. The "read current" is related with the voltage Vread, and the higher the voltage Vread is, the higher the current will be generated on read bit line RBL. To reduce the power consumption, the voltage Vread is kept low, as long as the generated current can be reliably detected by the current-detection circuit. For example, the voltage Vread may be in the range between about (1/5)*VDD and VDD, and may also be in the range between about (1/5)*VDD and about (4/5)*VDD in accordance with some embodiments.

Figure 15:
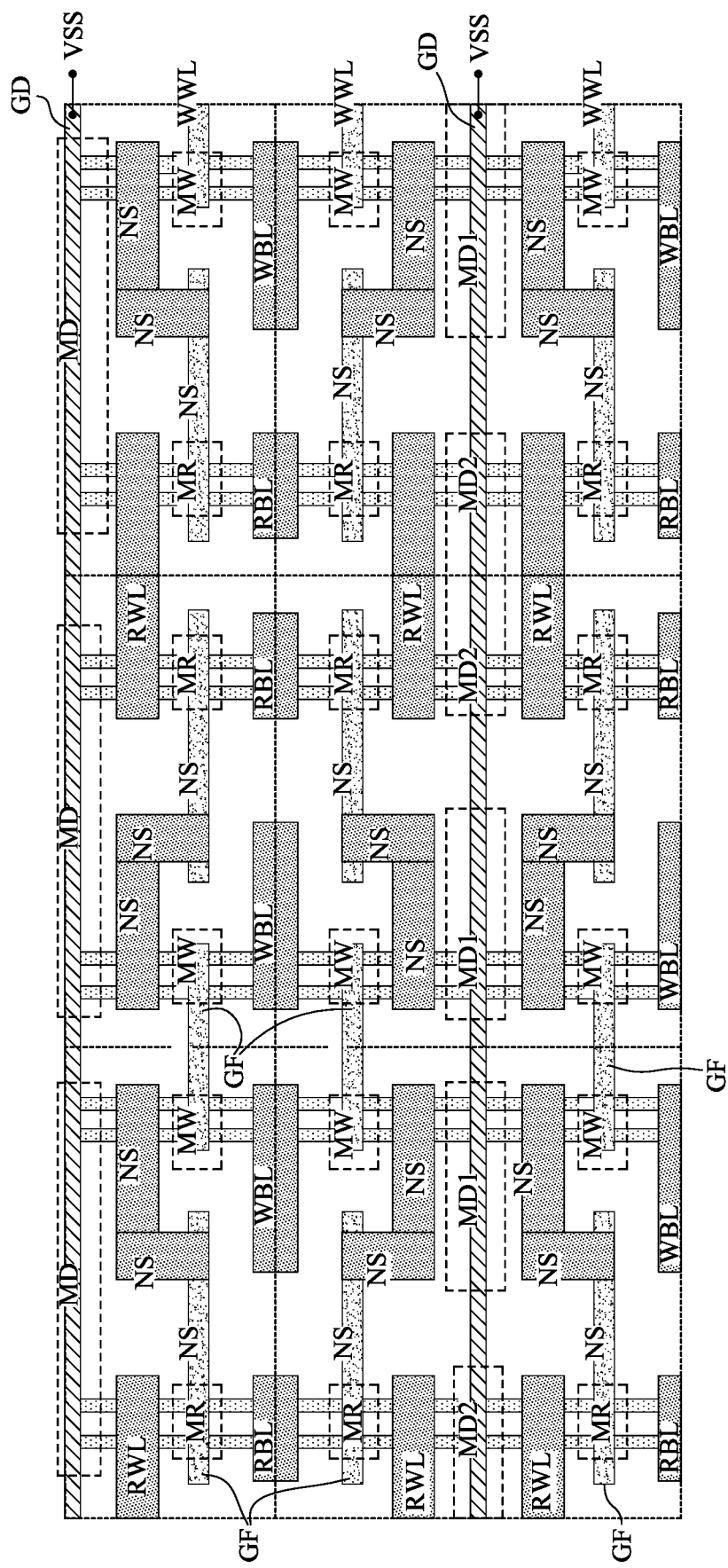
FIG. 15 illustrates the layout of a multi-fin memory cell pair formed using n-type transistors in accordance with some embodiments.

FIG. 15 illustrates a layout of the circuit shown in FIG. 11. This layout is similar to the layout shown in FIG. 9B, except that the source/drain regions of the transistors are n-type source/drain regions doped with n-type dopants. The transistors in the memory cells are multi-fin transistors. Accordingly, the response speed and the output current value of the memory cells will increase with the increase of number of the semiconductor fins.

The embodiments of the present disclosure have some advantageous features. The memory cells in accordance with the embodiments of the present disclosure have a small number of transistors. The operation speed of the corresponding memory array is improved. The density of the memory array is increased. The memory array may thus be used as the cache memory of high-performance computing processors.

In accordance with some embodiments of the present disclosure, a device comprises a write bit line and a read bit line extending in a first direction; a first write word line and a first read word line extending in a second direction perpendicular to the first direction; and a first memory cell comprising a first write transistor comprising a first gate connected to the first write word line; a first source/drain connected to the write bit line; and a second source/drain connected to a first data storage node; and a first read transistor comprising a second gate connected to the first data storage node; a third source/drain connected to the read bit line; and a fourth source/drain connected to the first read word line. In an embodiment, the first gate is connected to the first write word line through direct connection; the first source/drain is connected to the write bit line through direct connection; the second gate is connected to the first data storage node through direct connection; and the third source/drain is connected to the read bit line through direct connection.

In an embodiment, a total number of transistors in the first memory cell is equal to two. In an embodiment, both of the first write transistor and the first read transistor are p-type transistors. In an embodiment, both of the first write transistor and the first read transistor are n-type transistors. In an embodiment, the device further comprises a second write word line and a second read word line extending in the second direction; and a second memory cell having an identical structure as the first memory cell, wherein the second memory cell is connected to the write bit line, the read bit line, the second write word line, and the second read word line, and wherein the first memory cell and the second memory cell in combination form a first memory cell pair. In an embodiment, the device further comprises a second memory cell pair neighboring the first memory cell pair; and a dummy transistor connected between the first memory cell pair and the second memory cell pair.

In an embodiment, the dummy transistor comprises a first source/drain region connecting to the first data storage node of the first memory cell in the first memory cell pair; and a second source/drain region connecting to a second data storage node of the second memory cell in the second memory cell pair. In an embodiment, the dummy transistor comprises a first source/drain region connecting to the first read word line of the first memory cell in the first memory cell pair; and a second source/drain region connecting to the second read word line of the second memory cell in the second memory cell pair. In an embodiment, the device further comprises a current-detection circuit connected to the read bit line. In an embodiment, the device further comprises a voltage source circuit connected to the first write word line, wherein the voltage source circuit is configured to output a non-zero voltage lower than a positive power supply voltage VDD.

In accordance with some embodiments of the present disclosure, a device comprises a memory array comprising a plurality of memory cell pairs arranged in a plurality of columns and a plurality of rows, wherein each of the plurality of memory cell pairs comprises a first memory cell comprising a first write transistor, configured to write a first input data to a first data storage node in response to a first write signal; a first read transistor, configured to output a first output data to a read bit line in response to the first input data on the first data storage node and a first read signal; and a second memory cell, comprising a second write transistor, configured to write a second input data to a second data storage node in response to a second write signal; and a second read transistor, configured to output a second output data to the read bit line in response to the second input data on the second data storage node and a second read signal. In an embodiment, the first memory cell and the second memory cell are in neighboring rows of the memory array.

In an embodiment, the device further comprises a VDD voltage node; and a p-type dummy transistor comprising a source/drain region connecting to the first data storage node, wherein the p-type dummy transistor comprises a gate connecting to the VDD voltage node. In an embodiment, the device further comprises a VSS voltage node; and an n-type dummy transistor comprising a source/drain region connecting to the first data storage node, wherein the n-type dummy transistor comprises a gate connecting to the VSS voltage node. In an embodiment, the device further comprises a current-detection circuit connected to the read bit line, wherein the current-detection circuit is configured to measure a current on the read bit line.

In accordance with some embodiments of the present disclosure, a device comprises a write bit line and a read bit line extending in a first direction; a write word line and a read word line extending in a second direction perpendicular to the first direction; a memory cell comprising a write transistor comprising a first gate connected to the write word line; a first source/drain connected to the write bit line; and a second source/drain connected to a data storage node; and a read transistor comprising a second gate connected to the data storage node; a third source/drain connected to the read bit line; and a fourth source/drain connected to the read word line; a power supply node, wherein the power supply node is a VDD node or a VSS node; and a dummy transistor comprising: a third gate connected to the power supply node; and a fifth source/drain connected to the data storage node. In an embodiment, the dummy transistor is a p-type transistor, and wherein the power supply node is the VDD node. In an embodiment, the dummy transistor is an n-type transistor, and wherein the power supply node is the VSS node. In an embodiment, the memory cell is a two-transistor cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
   a write bit line and a read bit line extending in a first direction;
   a first write word line and a first read word line extending in a second direction perpendicular to the first direction;
   a first memory cell comprising:
      a first write transistor comprising:
         a first gate connected to the first write word line;
         a first source/drain connected to the write bit line; and
         a second source/drain connected to a first data storage node; and
      a first read transistor comprising:
         a second gate connected to the first data storage node;
         a third source/drain connected to the read bit line; and
         a fourth source/drain connected to the first read word line;
   a second write word line and a second read word line extending in the second direction; and
   a second memory cell having an identical structure as the first memory cell, wherein the second memory cell is connected to the write bit line, the read bit line, the second write word line, and the second read word line, and wherein the first memory cell and the second memory cell in combination form a first memory cell pair;
   a second memory cell pair neighboring the first memory cell pair; and
   a dummy transistor connected between the first memory cell pair and the second memory cell pair, wherein the dummy transistor comprises:
      a first source/drain region connecting to the first data storage node of the first memory cell in the first memory cell pair; and
      a second source/drain region connecting to a second data storage node of the second memory cell in the second memory cell pair.

2. The device of claim 1, wherein:
the first gate is connected to the first write word line through direct connection;
the first source/drain is connected to the write bit line through direct connection;
the second gate is connected to the first data storage node through direct connection; and
the third source/drain is connected to the read bit line through direct connection.

3. The device of claim 1, wherein a total number of transistors in the first memory cell is equal to two.

4. The device of claim 1, wherein both of the first write transistor and the first read transistor are p-type transistors.

5. The device of claim 1, wherein both of the first write transistor and the first read transistor are n-type transistors.

6. The device of claim 1 further comprising a current-detection circuit connected to the read bit line.

7. The device of claim 1 further comprising a voltage source circuit connected to the first write word line, wherein the voltage source circuit is configured to output a non-zero voltage lower than a positive power supply voltage VDD.

8. A device comprising:
a write bit line and a read bit line extending in a first direction;
a write word line and a read word line extending in a second direction perpendicular to the first direction;
a memory cell comprising:
a write transistor comprising:
a first gate connected to the write word line;
a first source/drain connected to the write bit line; and
a second source/drain connected to a data storage node; and
a read transistor comprising:
a second gate connected to the data storage node;
a third source/drain connected to the read bit line; and
a fourth source/drain connected to the read word line;
a power supply node, wherein the power supply node is a VDD node or a VSS node; and
a dummy transistor comprising:
a third gate connected to the power supply node; and
a fifth source/drain connected to the data storage node.

9. The device of claim 8, wherein the dummy transistor is a p-type transistor, and wherein the power supply node is the VDD node.

10. The device of claim 8, wherein the dummy transistor is an n-type transistor, and wherein the power supply node is the VSS node.

11. The device of claim 8, wherein the memory cell is a two-transistor cell.

12. A device comprising:
a write bit line and a read bit line extending in a first direction;
a first write word line and a first read word line extending in a second direction perpendicular to the first direction;
a first memory cell comprising:
a first write transistor comprising:
a first gate connected to the first write word line;
a first source/drain connected to the write bit line; and
a second source/drain connected to a first data storage node; and
a first read transistor comprising:
a second gate connected to the first data storage node;
a third source/drain connected to the read bit line; and
a fourth source/drain connected to the first read word line;
a second write word line and a second read word line extending in the second direction; and
a second memory cell having an identical structure as the first memory cell, wherein the second memory cell is connected to the write bit line, the read bit line, the second write word line, and the second read word line, and wherein the first memory cell and the second memory cell in combination form a first memory cell pair;
a second memory cell pair neighboring the first memory cell pair; and
a dummy transistor connected between the first memory cell pair and the second memory cell pair, wherein the dummy transistor comprises:
a first source/drain region connecting to the first read word line of the first memory cell in the first memory cell pair; and
a second source/drain region connecting to the second read word line of the second memory cell in the second memory cell pair.

13. The device of claim 12, wherein:
the first gate is connected to the first write word line through direct connection;
the first source/drain is connected to the write bit line through direct connection;
the second gate is connected to the first data storage node through direct connection; and
the third source/drain is connected to the read bit line through direct connection.

14. The device of claim 12, wherein a total number of transistors in the first memory cell is equal to two.

15. The device of claim 12, wherein both of the first write transistor and the first read transistor are p-type transistors.

16. The device of claim 12, wherein both of the first write transistor and the first read transistor are n-type transistors.

17. The device of claim 12 further comprising a current-detection circuit connected to the read bit line.

18. The device of claim 12 further comprising a voltage source circuit connected to the first write word line, wherein the voltage source circuit is configured to output a non-zero voltage lower than a positive power supply voltage VDD.

19. The device of claim 1, wherein the first memory cell is a three-transistor cell.

20. The device of claim 12, wherein the first memory cell is a three-transistor cell.

* * * * *